United States Patent [19]
Knier

[11] 3,974,498
[45] Aug. 10, 1976

[54] SWITCHING ARRANGEMENT FOR THE TRANSFORMATION OF DIGITAL ANGLES INTO ANALOG SINE-AND/OR COSINE VALUES

[75] Inventor: Hans Josef Knier, Penzberg, Germany

[73] Assignee: Siemens Aktiengesellschaft, Berlin & Munich, Germany

[22] Filed: Dec. 2, 1974

[21] Appl. No.: 528,941

[30] Foreign Application Priority Data
Dec. 3, 1973  Germany............................ 2359953

[52] U.S. Cl. .................... 340/347 DA; 340/347 SY
[51] Int. Cl.² ........................................ H03K 13/04
[58] Field of Search ............. 340/347 DA, 347 SY; 235/197

[56] References Cited
UNITED STATES PATENTS

| | | | |
|---|---|---|---|
| 3,241,133 | 3/1966 | Herzl | 340/347 DA |
| 3,277,464 | 10/1966 | Naydan | 340/347 DA |
| 3,675,234 | 7/1972 | Metz | 340/347 DA |
| 3,728,719 | 4/1973 | Fish | 340/347 DA |
| 3,831,168 | 8/1974 | Gronner | 340/347 DA |

Primary Examiner—Charles D. Miller
Attorney, Agent, or Firm—Hill, Gross, Simpson, Van Santen, Steadman, Chiara & Simpson

[57] ABSTRACT

A switching arrangement for generating sine and/or cosine function analog outputs in response to input digitally coded angle values where a correspondingly coded digital to analog converter is compensated by means of a correction circuit comprising a resistance network controlled by switches responsive to the input angle. Preferably the correction circuit is interposed between a constant voltage source and the converter so that the reference voltage supplied to the converter is precompensated to achieve sine and cosine output values of a desired precision.

13 Claims, 11 Drawing Figures

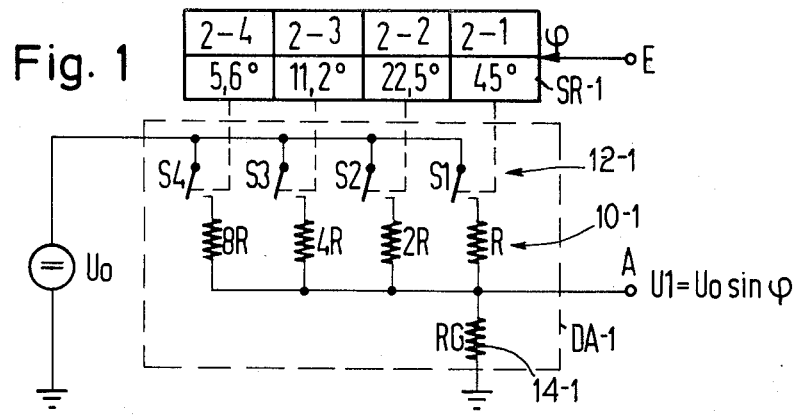
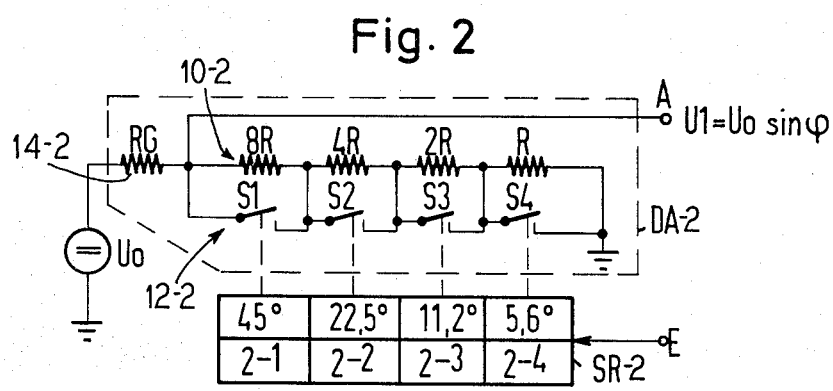
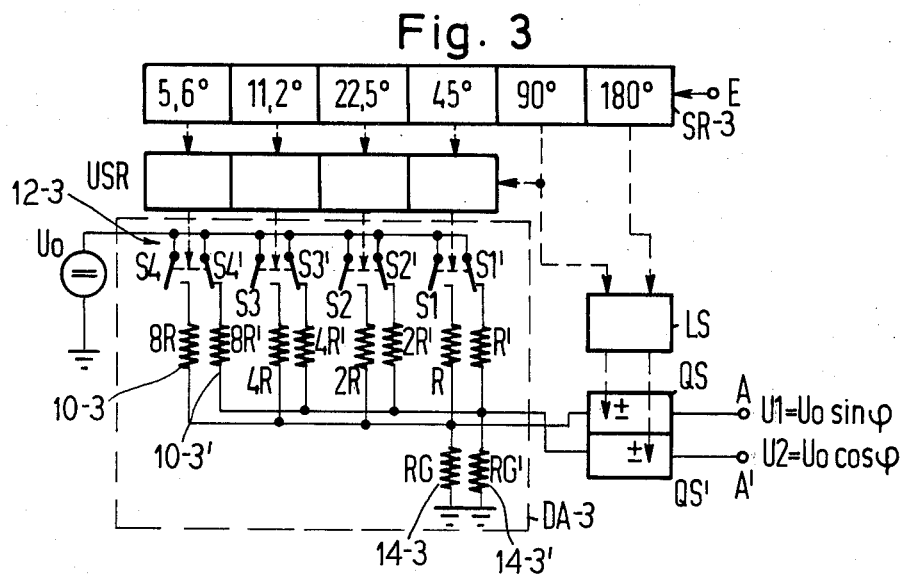

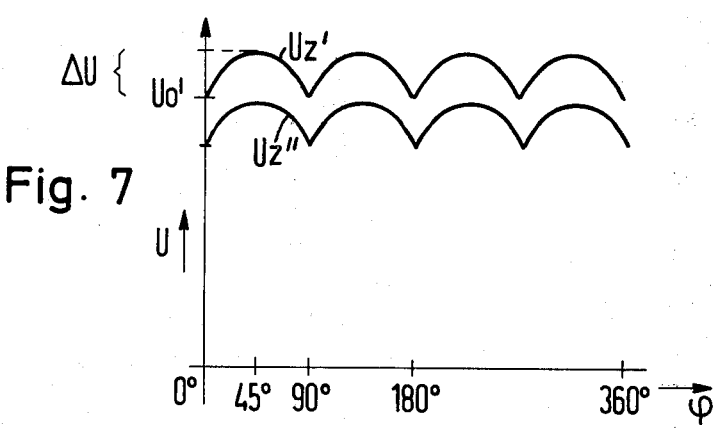
Fig. 7
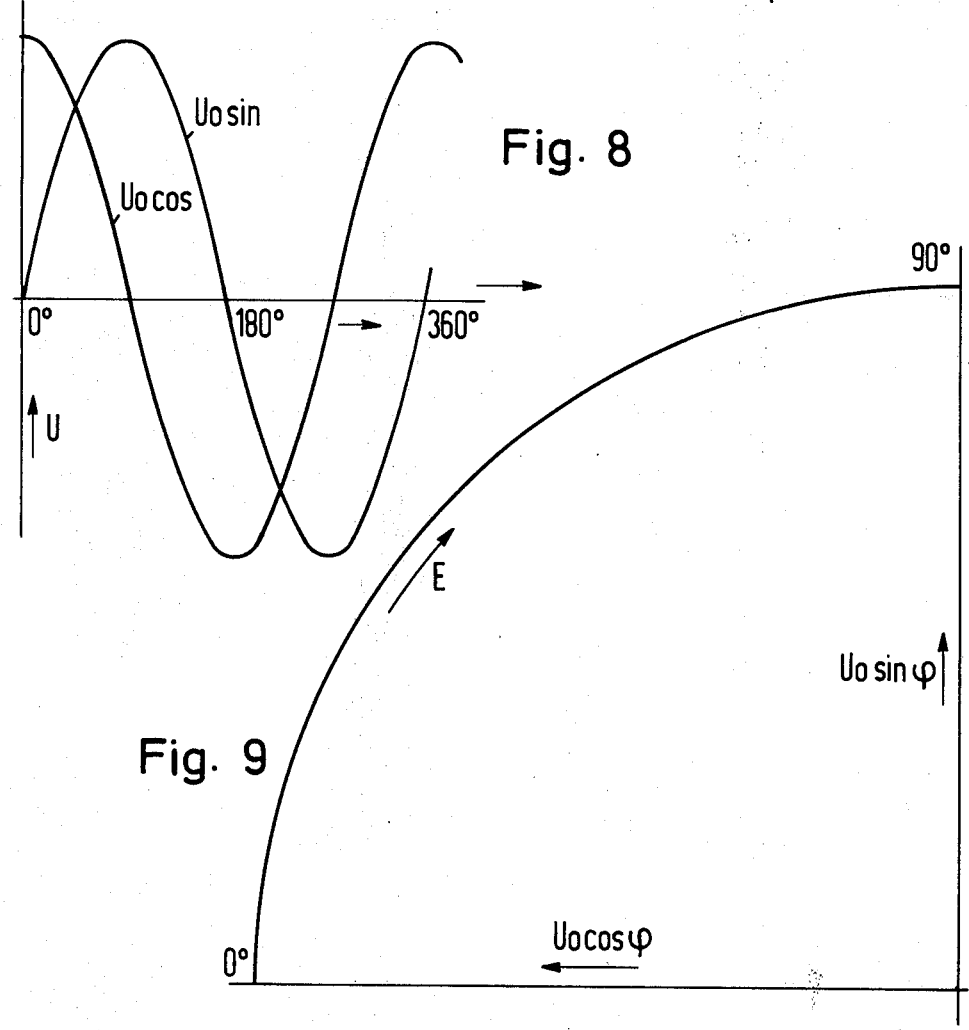
Fig. 8
Fig. 9

SWITCHING ARRANGEMENT FOR THE TRANSFORMATION OF DIGITAL ANGLES INTO ANALOG SINE-AND/OR COSINE VALUES

BACKGROUND OF THE INVENTION

Switching arrangements are known for generating sine and cosine outputs in analog form in response to digitally coded angle values, an example being found in U.S. Pat. No. 3,134,098. In this example of prior art, a digital source representing the angle values in binary code controls the switching of resistance strings of a nonlinear impedance network. The respective resistance values controlled by the respective switches correspond to the respective digit values of the respective binary orders. In effect, this prior art disclosure seeks to approximate the sine and cosine functions by means of curved segments generated from the linearly graded resistance strings because of circuit nonlinearity. In particular the load impedance is selected more or less empirically to provide the best possible fit between the "curved segments" and the desired function. The constant amplitude reference source may be an alternating current voltage source with series resistance of a moderately high value interposed between the source and the parallel combination of resistance string and load impedance, permitting the reference voltage applied to the resistance string to change in response to code induced resistance changes in the resistance string, or the nonlinear response may be obtained by omitting the series resistance and connecting a constant current source directly to the resistance string.

SUMMARY OF THE INVENTION

The present invention relates to a switching arrangement for the generation of trigonometric functions in analog form in response to input angles expressed in digital form.

In a preferred embodiment a resistance network is provided consisting of a series of $n$ individual resistors whose resistance values are selected according to a certain function. A digital control register registers the input angle in digital form and has $n$ register stages (or register points) for representing respective digit values which are graded so that the control register is capable of representing angles at least in a range from zero degrees to forty-five degrees according to the same function as the resistance values and with a respective one of the register stages thus being assigned to each of the individual resistors. The digital-to-analog converter circuitry further includes a constant voltage source such that the reference voltage supplied by such source will be essentially independent of the angle value registered in the digital control register. This is effected in all cases where the load impedance is much higher than the internal impedance of the source. The converter circuitry then further includes a selectively switched correcting circuit preferably in the form of a second resistance network and a series of switches controlled in accordance with the input angle to create an angle-dependent compensating function whose analog variation as a function of input angle modifies the overall analog output of the converter circuitry so as to approximate the exact course of the trigonometric function or functions to a desired precision.

A characteristic concept of the preferred embodiment resides in the provision of a compensating function (such as illustrated in FIG. 7) which varies periodically at a harmonic rate as a function of input angle in comparison to the variation of the sine or cosine value with input angle.

A preferred feature of the invention relates to the interposition of the correcting network between the constant amplitude reference source and the resistance network, such that both a sine function output and a cosine function output may be subjected to a common precompensating function.

While the illustrated embodiment of FIG. 6 represents a preferred implementation of the invention it will be apparent that the selectively switched correcting network concept can be applied to other known forms of digital-to-analog converter circuits, for example to the nonlinear impedance type converter circuit of U.S. Pat. No. 3,134,098, and many objects, features and advantages of the invention will be apparent to those skilled in the art form the following detailed description taken in connection with the accompanying drawings.

BRIEF DESCRIPTION OF THE DRAWINGS

FIG. 1 is a diagrammatic illustration showing a digital-to-analog converter for trigonometric functions, and useful for explaining certain of the concepts of the present invention;

FIG. 2 is a diagrammatic showing of a second form of digital-to-analog converter for trigonometric functions, and useful for explanation of an alternative implementation of the concepts and teachings of the present invention;

FIG. 3 is a diagrammatic illustration of a digital-to-analog sine-cosine converter utilizing the circuit approach of FIG. 1, and illustrating the concept of the present invention of inverting the signals from the lower order stages of the digital control register during alternate ninety degree intervals, such that a given resistance network such as that indicated in FIG. 1 or FIG. 2 may generate a sine or cosine function.

FIG. 7 shows a plot of a precompensation function, namely a precompensation voltage function Uz' such as generated by the correcting circuit DA2 of FIG. 6;

FIG. 8 shows a plot of the sine function output as a function of angle as obtained using a switching arrangement such as shown in FIG. 6;

FIG. 9 shows a plot similar to FIG. 5 but showing the locus of a vector constructed of the components U1 and U2 in the angle range from 0° to 90° for the example of FIG. 6;

DESCRIPTION OF THE PREFERRED EMBODIMENTS

Figure 6:
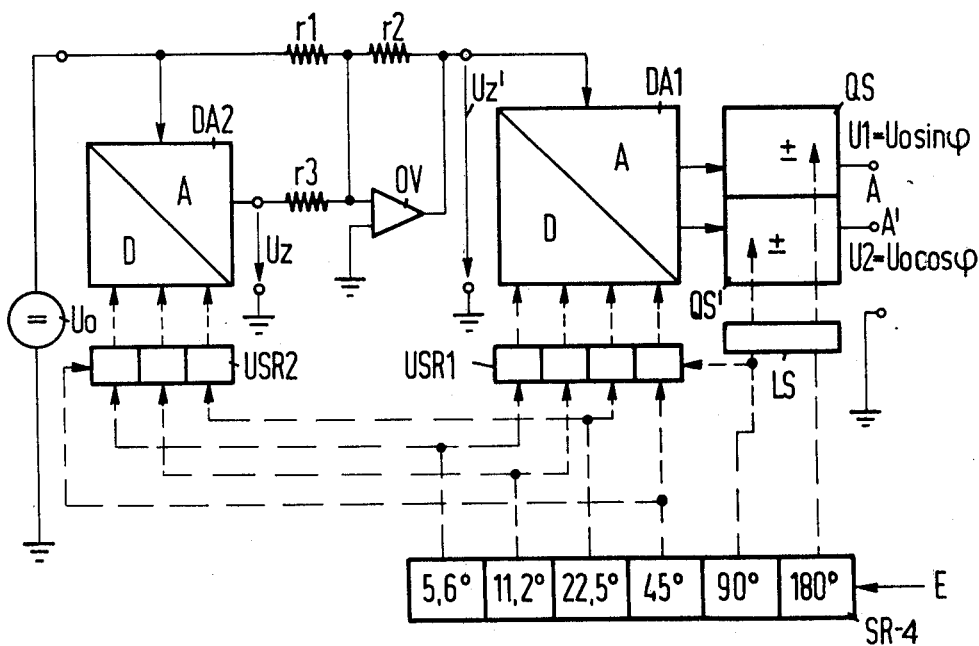
FIG. 6 shows in a block diagram a sample embodiment of a switching arrangement according to the present invention.

The invention refers to a switching arrangement for the transformation or conversion of digital angle values to analog sine and/or cosine output functions by using a constant voltage source such as Uo, FIGS. 1, 2, 3 and 6, which is connected to a digital-to-analog converter circuit such as DA-1, FIG. 1, DA-2, FIG. 2, DA-3, FIG. 3, or DA1, FIG. 6. Such converter circuits comprise first resistance networks consisting of a series of $n$ individual resistors, which resistors have respective resistance values stated or graded according to a certain function. For the sake of an example, a plural order digital code function, namely the natural binary code, has been utilized in the illustrated embodiments, the individual resistors having resistance values proportional to the successive digit values or orders of such code function. Thus, in the illustrated embodiment, the $n$ resistors have resistance values with a gradation in accordance with a geometrical series, and specifically in accordance with successive powers of two. For the sake of explanation, a simplified example is given where the $n$ individual resistors are given weights of R, 2R, 4R and 8R. A digital control resistor is indicated at SR-1, FIG. 1, SR-2, FIG. 2, SR-3, FIG. 3 and at SR-4, FIG. 6, which includes a series of $n$ register stages (or register points) for registering digital angle values at least in a range from 0° to 45° according to the same function as the resistance values of the resistance networks. Accordingly, each register stage is assigned to a respective one of the individual resistors and controls an associated switching circuit so as to produce respective circuit configurations to represent the respective angle values.

Such arrangements are for instance known from the U.S. Pat. No. 3,134,098. To explain their function, FIGS. 1 and 2 may be referred to as illustrating two simple examples of digital-to-analog angle converters for generating analog output voltages approximating the sine or cosine of an input angle expressed in digital form. In both cases a constant voltage source Uo is connected with a resistance network, consisting of a series of $n$ resistors. Such arrangements may further include a common resistor such as generically designated RG in FIGS. 1 and 2 which is permanently connected in series with the resistance network. In the examples of FIGS. 1 and 2, a series of four individual resistors are shown (i.e. $n$ equals four) so as to provide a very rough quantization, the four resistors being designated in accordance with relative resistance values R, 2R, 4R, and 8R, for the example of a natural binary code function as previously mentioned. Thus, the resistance values form a geometric series with a factor of 2. The resistors of the series might have values of 1000 ohms, 2000 ohms, 4000 ohms and 8000 ohms, for example (R = 1000 ohms).

Referring specifically to the converter circuit DA-1 of FIG. 1, the resistors are selectively connected in respective parallel circuit configurations by means of a switching circuit including switches diagrammatically indicated at S1, S2, S3 and S4. For the control of the switching circuit, any suitable coupling may be provided between the control register SR-1 and the respective switches as represented by the respective dash lines. The respective stages of the control register SR-1 have been assigned respective orders or digit values of a binary code, and as indicated may represent angle values of 45°, 22.5°, 11.2° and 5.6°. As is well understood in the art, a code function is preferably utilized such that a number of angle values can be represented substantially in excess of the number of code positions or orders. The angle values in digital form may be supplied serially from an input as represented at E, and the total angle value represented by the condition of the control register is converted by means of the converter circuit DA-1 to an analog voltage value at output A. The control of the register SR-1, for example the supply of the angle information to the register, may take place in any known manner via a suitable angle generator, and the angle generator may supply digital input signals to the register SR-1 either serially or in parallel.

For the specific example shown in FIG. 1, for the case of an angle value of 0°, all of the switches S1 through S4 are opened. For the case of an angle value of 5.6°, only switch S4 is closed and at output A a relatively small voltage is created. For the case of an angle value of 11.2°, only switch S3 is closed, and switches S1, S2 and S4 are opened, so that the voltage at output A increases to a larger value. For the case of an angle value of 22.5° only the switch S2 is closed, and for the case of an angle value of 45°, only switch S1 is closed. As is understood in the art, with the arrangement of FIG. 1, a voltage can be produced at output terminal A which roughly corresponds to the function U1 equals (Uo)(sinep) over the range of angles which can be represented by the associated stages of the control register SR-1.

In FIG. 2 the $n$ resistors R, 2R, 4R and 8R are, in distinction to the arrangement of FIG. 1, selectively connected in respective series circuit configurations in accordance with the angle values represented in digital form in the control register SR-2. A common resistor is shown in FIG. 2 and designated generically by the reference character RG, but the value of this resistor does not necessarily correspond to the value of the resistor RG of FIG. 1. Similarly the resistance value R in FIG. 2 does not necessarily correspond to the resistance value R in FIG. 1. The generic designations of resistors and switches in FIGS. 1 and 2 is considered desirable from the standpoint of a conventional representation of the respective digital-to-analog converter circuits DA-1 and DA-2, and the resistance and switch designations should not be confused with reference characters intended to designate a particular element of a specific circuit. In other words, the designations are in the nature of graphic symbols in their principal function.

For the sake of reference numeral designation of specific components in FIGS. 1 and 2 reference numerals 10-1 and 10-2 have been applied to the respective resistance networks, reference numerals 12-1 and 12-2 have been applied to the respective switching circuits, and numerals 14-1 and 14-2 reference the respective series resistors (generically designated RG).

In the illustrated circuit if all of the switches S1 through S4 are closed, a voltage of zero volts is produced at the output A. If only the switch S4 is opened, a relatively small voltage corresponding to an angle of 5.6° results at output A. If only the switch S3 is opened representing an angle of 11.2°, the voltage will increase correspondingly. If the switch S2 is opened with the other switches closed, the output represents the sine of an angle 22.5°, while if the switch S1 is opened with all of the other switches closed, the output approximates the sine of an angle of 45°. Accordingly, the converter circuit DA-2 may be operated to approximate the function U1 equals $(Uo)(\sin\rho)$.

In general, the registered angle value is determined by the stages of the control register SR-2. For the case of a binary code as illustrated, the register stages having a binary one digit are evaluated to determine the angle value represented. Thus, in FIG. 2, specifically, an angle value of 50.6° would be represented by the presence of a binary one digit in the stages of register SR-2 having weights or digit values of 45° and 5.6°. For the generation of the sine function, the registered binary one digits would cause the corresponding switches S1 and S4 to be opened.

For the representation of cosine functions in the embodiments of FIGS. 1 and 2, the switches would be operated in a complementary sense in response to binary one digits, such that for an angle of zero, the output in FIGS. 1 and 2 would be at a relative maximum, the output progressively diminishing for progressively increasing angle values within the first quadrant.

FIG. 3 shows an especially simple constructed version employing two resistance networks 10-3 and 10-3', and a switching circuit 12-3 for connecting the resistance networks in respective circuit configurations representing the registered angle and the complement of the registered angle. In this embodiment, the respective stages of the control register SR-3 control respective sets of switches of the switching network 12-3 which are in vertical alignment therewith. Interposed between the control register and the respective sets of switches, however, is a switching register USR which may serve to selectively invert the signals supplied from the control register SR-3 to the switching network 12-3. Thus, the switch pair S4, S4' is responsive to the condition of the stage of control resister SR-3 having a weight of 5.6°, but may be operated either in response to the direct output of such stage, or in response to the complement of such output. The respective corresponding resistors of the switching networks 10-3 and 10-3' have equally large resistance values, and such resistance values may have proportions as indicated by the graphic designations, as is well understood by those skilled in the art. Similarly, the RG and RG' resistors 14-3 and 14-3' have equally large resistance values. The ratio between the admittance values of the resistor 14-3, or respectively 14-3', and the maximum admittance of the network 10-3 (in the case that all corresponding switches are closed), or respectively of the network 10-3', is selected as 1.801 (according to U.S. Pat. No. 3,325,805 issued June 13, 1967). Referring to the switching circuit 12-3, one of the switches with the same number index, that is one switch of each pair is always opened, while the other one is closed. Thus, from the explanation given with respect to FIG. 1, it will be understood that the output across resistor 14-3 may approximate an analog sine function of the registered angle, while the output across resistor 14-3' may approximate the cosine function of the registered angle.

The control resistor SR-3 has two additional register points or stages denoted with 90° and 180°, whereby the quadrant of the registered angle can be represented. By this arrangement, angle values between 0° and 360° can be approximated. For this purpose, the control register SR-3 is coupled with the switching circuit 12-3 under the control of the switching register USR, and additional components LS, QS and QS' are provided. The switching register USR is controlled from the 90° register stage in such a way that for the angle range from 0° to 90° and from 180° to 270°, the digit conditions of the respective lower order stages are transmitted directly to the switching circuit 12-3 without inversion, while in the angle areas from 90° to 180° and from 270° to 360°, the switching register USR is controlled to act as an inverter for the individual bits or binary signals from the lower order stages representing angle values of 5.6°, 11.2°, 22.5° and 45°. In this way, the required amplitude values to approximate the sine and cosine functions, respectively, can be generated.

For the control of sign of the sine and cosine functions respectively, the registering point or stage having the weight or significance of 180° is provided in the control register SR-3. The register stage marked 90° and the register stage marked 180° are directed to a logic circuit LS whose outputs are connected with two reversing switches QS and QS'. The input to the logic circuit LS designates the quadrant of the registered angle, and the reversing switches QS and QS' provide the desired output polarities for the sine and cosine functions. In particular, the reversing switch QS is controlled to provide negative sine function values at A for the range from 180° to 360°. The reversing switch QS' is operated by the logic circuit so as to provide negative values of the cosine output signal at A' for the range of registered angles from 90° to 270°.

The provision of such logic circuitry and reversing switch means is well understood in the art.

Figure 4:
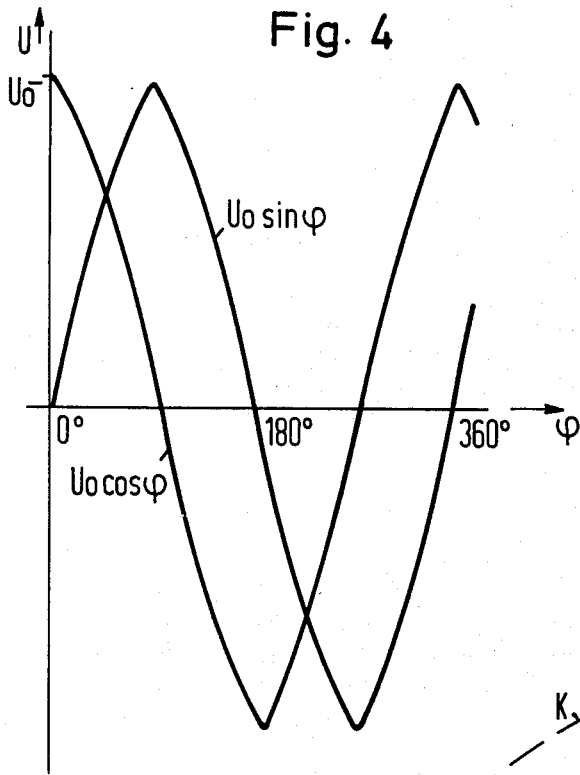
FIG. 4 is an illustration of the sine and cosine functions as generated by a circuit such as shown in FIG. 3, in the absence of any compensation as taught by the present invention.
Figure 5:
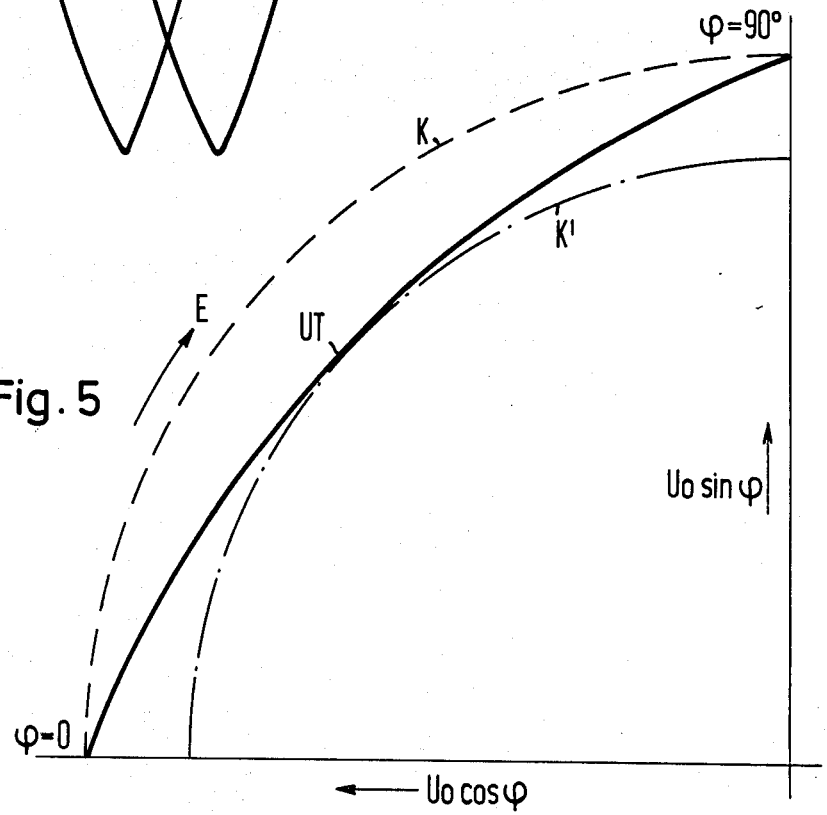
FIG. 5 is a diagrammatic illustration useful in explaining the concepts of the present invention and showing by means of a solid line UT a curve produced by plotting a vector with the components U1 and U2 for angles between zero and 90° and the digital-to-analog sine-cosine converter circuit such as shown in FIG. 3.

In FIG. 4, the sine and cosine functions are plotted for the digital analog converter circuit of the type shown in FIG. 3 and for the case of a quantization of the input angle in increments of 0.1°. The thus achieved sine function shows deviations as compared to an exact sine waveform, and FIG. 5 illustrates a plot which according to the teachings of the present invention illustrates the degree of error as a function of angle. In particular in FIG. 5, the ordinate represents the output at A in FIG. 3, while the abscissa represents the cosine function output at A' of FIG. 3. The actual output with a circuit of the type shown in FIG. 3 and with a quantization of 0.1° is illustrated by the solid line UT in FIG. 5, while circular arcs are represented by the dash lines K and K' to show the ideal or exact functions which bound the actual plot UT. For the dash line plot K, the actual output UT coincides with the ideal output for angle values of 0° and 90°, and multiples of 90°, while the maximum deviation occurs at an angle of 45° and at odd multiples of 45°.

The degree of error can also be considered in relation to the circular arc represented by the dot dash line K' which coincides with the actual plot UT at an angle of 45°, and with respect to which the error shows a maximum at an angle of 90° and at even multiples of 90° including 0°.

The principal concept of the invention is related to the task of finding a way which makes it possible to decrease the amplitude error occurring in digital to-to-analog converter circuitry as much as possible, so that a given trigonometric function can be approximated with a desired degree of precision. According to the invention, a switching arrangement of the above mentioned type is provided, and compensation for errors in the analog output thereof is achieved by means of a correcting circuit. In the preferred embodiment, the correcting circuit comprises a second resistor network which may be of the type illustrated in FIG. 1 or FIG. 2. Such second resistor network is provided with a second switching circuit comparable to the switching circuits of FIGS. 1-3 and may include respective switches assigned to respective lower order angle register stages such that an angle-dependent variable voltage or analog compensation function is generated. The joint operation of the converter circuits and the correcting circuits produces a compensated analog output which more nearly approximates the desired trigonometric function. Thus in the known arrangements amplitude errors can be diminished to a large extent. An advantageous further development of the invention consists in that the correcting circuit is connected between the constant voltage source and the first resistor network or networks so as to provide a precompensation for the errors of such first resistor network. This is especially favorable if a sine and a cosine function are to be generated simultaneously at respective converter outputs such as indicated at A and A' in FIG. 3.

Furthermore, it may however also be advisable in other cases to connect the correcting circuit to the output of the first resistor network such that a postcompensation is effected for errors in the approximation provided by the first resistor network.

A circuit requiring a minimum of cost and effort can be achieved if the voltage created by the correcting circuit shows maxima in the case of angle values which are odd multiples of 45° and shows minima for angle values which are even multiples of 90° including 0°.

The invention as well as further developments of the invention will be explained hereafter having reference to FIGS. 6 through 11 of the drawings.

In FIG. 6, a constant voltage source Uo is shown which may provide a stabilized constant amplitude voltage (AC voltage or DC voltage). A digital-to-analog converter circuit DA1 is connected via the compensation circuit, containing the resistors $r1, r2, r3$, the operational amplifier OV and the digital-to-analog-converter circuit DA2 with the constant voltage reference source. The control register SR-4 has a series of stages corresponding to those of the control register SR-3, FIG. 3. The circuit DA1 may conform with the circuit DA-3 of FIG. 3, and the switch register USR1 may conform with the switch register USR of FIG. 3. Further, the logic circuit LS, and the polarity reversing switches QS and QS' may be identical with those of FIG. 3. Accordingly, it is considered that the output terminals A and A' in FIG. 6 are directly analogous to the correspondingly designated terminals in FIG. 3. More generally, the converter circuit DA1 can be implemented in accordance with any of the circuits DA-1, DA-2 and DA-3 of FIGS. 1-3. To avoid the use of two separate control registers for resistance networks such as shown at 10-1 and 10-2, respective pairs of resistance networks may be employed in conjunction with switching circuitry such as indicated at 12-3 in FIG. 3.

Prior to the resistor $r1$ a correcting circuit DA 2 is provided in the form of a second digital analog converter. This circuit may be implemented in accordance with the converter circuit DA-1 of FIG. 1 or DA-2 of FIG. 2 and is shown in FIG. 6 as being provided with a switching register USR2 which is constructed similar to the switching register USR1. The difference in the function consists merely in that only three angle values are supplied to the correction circuit DA 2, specifically binary signals from the stages of register SR-4 having the weights of 5.6°, 11.2° and 22.5°. The register USR2 is controlled from the fourth stage of control register SR-4 representing a weight or digit value of 45°, so that the output from the switch register USR2 may be inverted for alternate angle ranges such as the ranges from 45° to 90°, from 135° to 180°, from 225° to 270°, and from 315° to 360°. It will be observed from FIG. 7 that the compensation function Uz' resembles a sine function or more closely a rectified sine wave with the exception that the half wave period is equal to 90° rather than 180°. The compensation function based on the teachings of FIG. 5 thus has characteristics of a rectified harmonic compensation function. More specifically, the half wave period corresponds to the second harmonic of a rectified sine wave function.

The output of the correcting circuit DA 2 is supplied via a resistor $r3$ the input of an operational amplifier OV which has the resistor $r2$ connected between the output and input thereof. The output of the operational amplifier OV is designated Uz' and is coupled to the input of the digital converter circuit DA1. Circuit elements $r1$, $r2$ and OV only serve to combine the output voltage Uz of the correcting circuit DA2 and the voltage Uo of the constant voltage source and to provide a range of amplitudes for the input or reference voltage Uz'. The amplitude of the input voltage Uz' can of course be selected by the proper choice of circuit values for the interposed circuit elements.

For the specific compensation function Uz' produced in FIGS. 6 and 7, the output of the correcting circuit provides a certain constant value Uo' for angle values of 0°, 90°, 180°, 270° and 360°, that is for integral multiples of 90°. The compensation function of FIG. 7 increases for angles from 0° to 45° from the minimum value Uo' to a maximum value (Uo') plus (ΔU). The function Uz' then decreases for angle values from 45° to 90° to the minimum value Uo', and so on. In the case of odd multiples of 45°, the maximum value of Uz' is produced, while in the case of even multiples of 45° including 0° the compensation function Uz' has the minimum value Uo'. Accordingly, in the ranges of input angle on both sides of odd multiples of 45°, the input of the digital-to-analog converter circuit DA1 receives a non-linearly increasing and decreasing precompensation voltage Uz' which has the waveform Uz', FIG. 7. This leads to the result that in the range centered at odd multiples of 45°, the output voltage of converter circuit DA1 is increased such that the curve UT of FIG. 5 is shifted toward conformance to the circular arc K. Accordingly, the precompensation function Uz' serves to diminish the amplitude error exhibited by the converter circuit DA1, considered alone.

Referring to FIG. 5, if the circular arc K' is taken to be the desired error-free function, then the input voltage Uz' should have a waveform Uz'' as a function of angle similar to the waveform Uz' of FIG. 7 but multiplied by a factor formed by the ratio of the radius values of K' and K of FIG. 5, so as to compensate for the errors between the actual curve UT and the desired curve K' in FIG. 5 which have their maxima at 0° and at even multiples of 45°.

With the circuit of FIG. 6 including a compensating function such as represented in FIG. 7, the output sine and cosine functions are illustrated in FIG. 8 and show in comparison to FIG. 4 considerably better approximations to the ideal functions.

FIG. 9 shows a plot similar to that of FIG. 5 and illustrating the case where the outputs at A and A' of FIG. 6 are plotted for angles between 0° and 90°. The compensated curve of FIG. 9 shows the improvement obtained with the use of the correction circuit of the present invention and shows a curve which very closely approximates an ideal circular arc.

Figure 10:
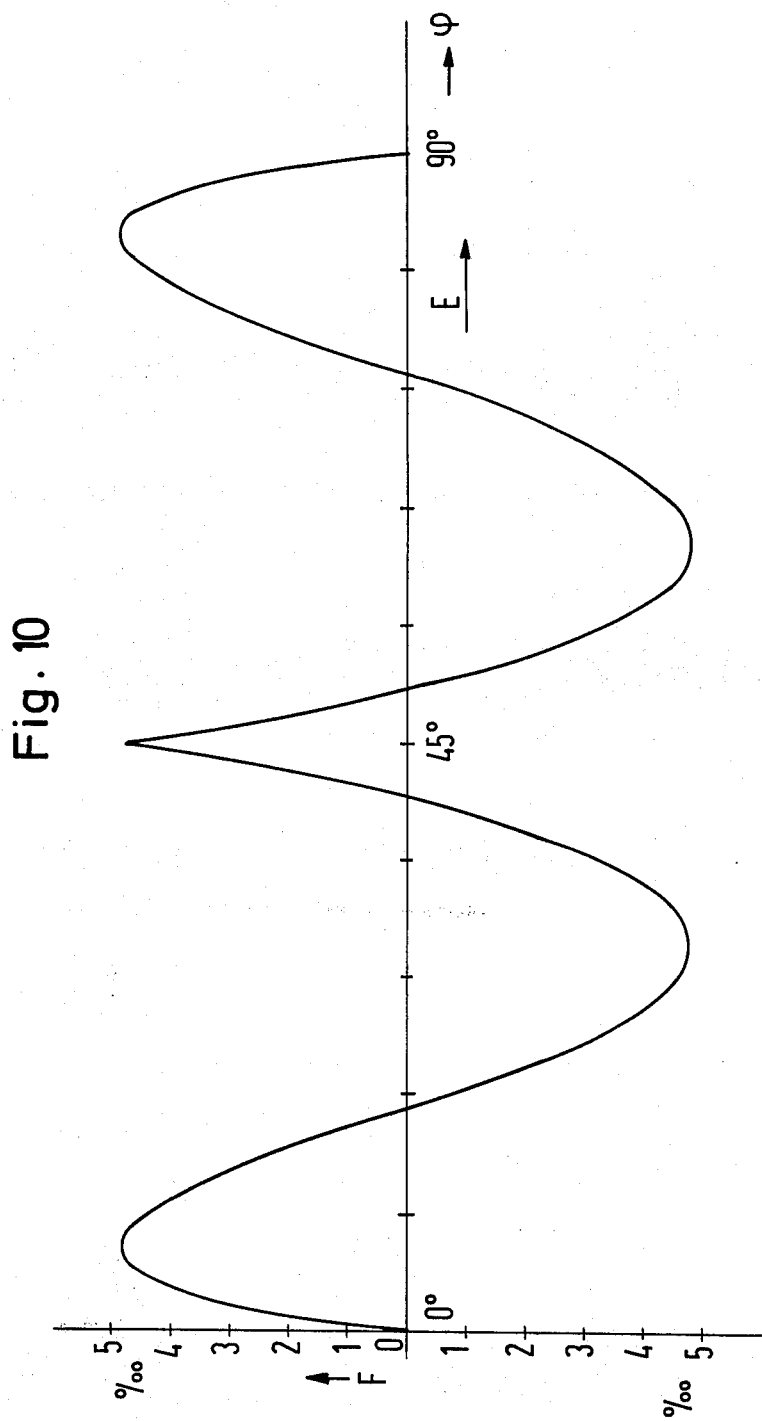
FIG. 10 shows a plot of the error as a function of angle in the range from zero to 90° obtained with the example of FIG. 6.

In FIG. 10, the error between the output of FIG. 6 and the ideal function has been plotted for a range of angles between 0 and 90°. As illustrated, for a converter circuitry in accordance with FIG. 6, the compensated sine and cosine functions exhibit reduced errors which do not exceed plus or minus 5 pro mille (per thousand), whereas an uncorrected circuit according to FIG. 3 would result in a maximum error of approximately plus or minus 7 percent.

Figure 11:
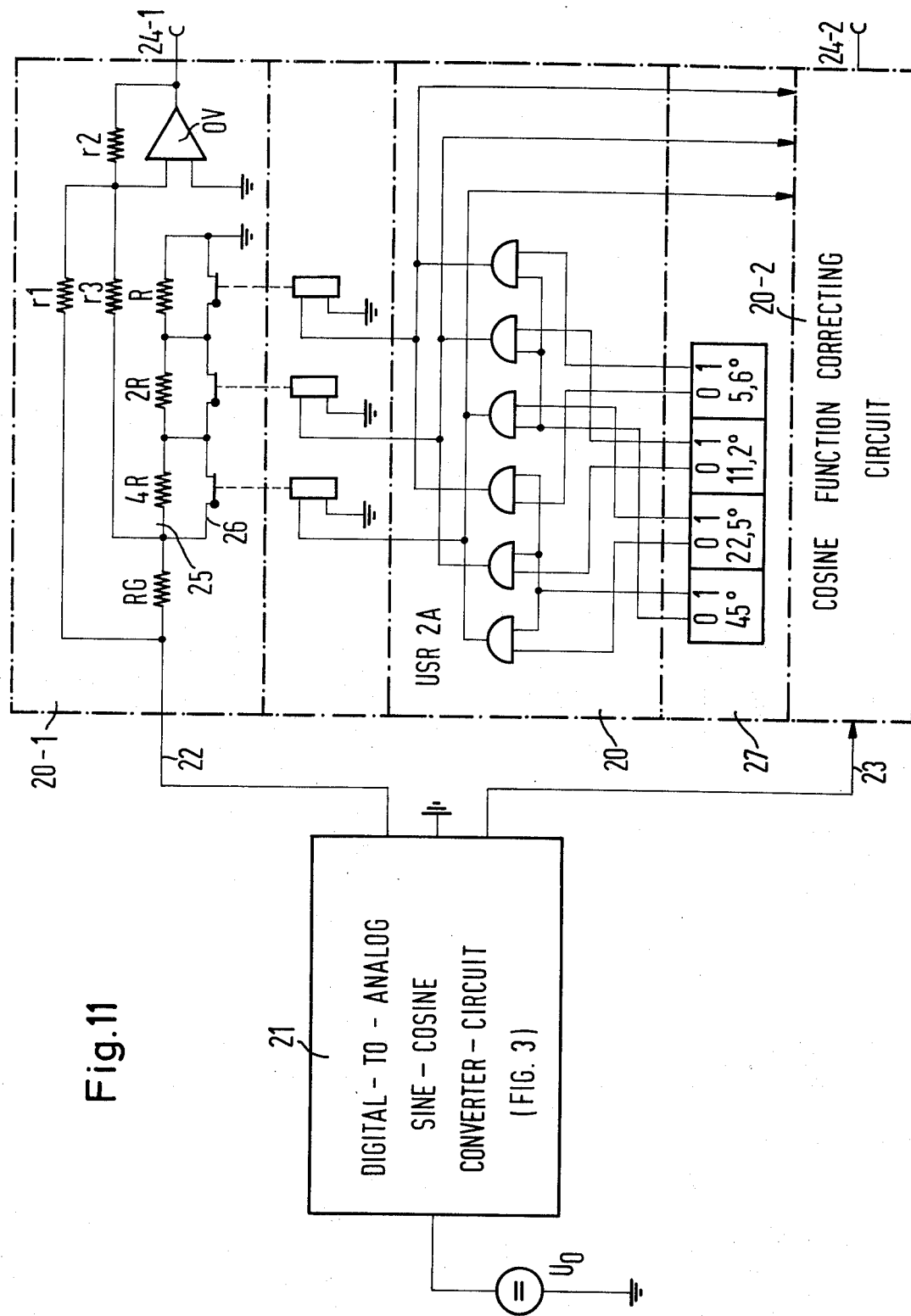
FIG. 11 illustrates an alternative arrangement where sine function and cosine function correcting circuits are connected following the sine-cosine converter circuit of FIG. 3 so as to provide post-compensated sine function and cosine function outputs in accordance with the teachings of the present invention.

FIG. 11 is included to show in the drawings an alternative where a correcting circuit 20 is connected with the sine and cosine function outputs of a digital-to-analog sine-cosine converter circuit 21 corresponding to that shown in FIG. 3. In this case, the converter circuit 21 receives its reference input directly from the constant amplitude reference source $U_o$ and supplies an uncorrected sine function at output 22 and an uncorrected cosine function at output 23. For the illustrated example, the correcting circuit 20 may include a sine function correcting circuit 20-1 and a cosine function correcting circuit 20-2. The sine function correcting circuit 20-1 is shown as being interposed between converter circuit 21 and converter output terminal 24-1, while the cosine function correcting circuit 20-2 is shown as interposed between the converter circuit 21 and the converter output terminal 24-2. As indicated, terminal 24-1 is to supply a post-compensated sine function output while the terminal 24-2 is to supply a postcompensated cosine function output. For the sake of a different example, resistance network 25 and switching circuit 26 of correction circuit 20-1 are shown as conforming with the low order stages of the circuit of FIG. 2, and a separate control register 27 has been indicated which, of course, may actually form part of the control register of converter circuit 21. An exemplary switching register is indicated at USR 2A. FIG. 11 will serve to illustrate exemplary details of a suitable switching register circuit for the correcting circuits of FIGS. 6 and 11.

BACKGROUND DISCUSSION

For the sake of background, the tables on the following pages will serve to illustrate the operation of FIGS. 1 and 2 to approximate a sine function using generally linear segments such as indicated in FIG. 4.

Referring to the cosine function of Table 2B and to the cosine output representations at the extreme right in Table 3A, it will be understood by those skilled in the art that differences of one quantum increment between the sine and cosine functions with respect to 45° will not be significant where a sufficiently small quantum increment is chosen. Further, it is known in the art to modify the code function in different quadrants so as to equalize the sine and cosine functions at 45°, and it is also known to provide an additional resistance element in association with a cosine-representing resistance network for the same equalization purpose.

It will be apparent that many further modifications and variations may be effected without departing from the scope of the novel concepts of the present invention.

TABLE 1

OPERATION OF FIG. 1 TO APPROXIMATE THE FUNCTION $U1 = U_o \sin \Phi$

| Analog Value of Angle $\Phi$ in Degrees | Condition of Switches S1 – S4 | | | | Analog Amplitude of Output at A in Volts $RG = \frac{R}{2} \cdot \frac{1}{1.801}$ |
|---|---|---|---|---|---|
| | S4 (5.6°) | S3 (11.2°) | S2 (22.5°) | S1 (45°) | |
| 0 | Open | Open | Open | Open | Zero |
| 5.6 | Closed | Open | Open | Open | $U_o \cdot 0.0335$ |
| 11.2 | Open | Closed | Open | Open | $U_o \cdot 0.0650$ |
| 16.8 | Closed | Closed | Open | Open | $U_o \cdot 0.095$ |
| 22.5 | Open | Open | Closed | Open | $U_o \cdot 0.122$ |
| ⋮ | | | | | |
| 45 | Open | Open | Open | Closed | $U_o \cdot 0.217$ |
| 50.6 | Closed | Open | Open | Closed | $U_o \cdot 0.243$ |
| 56.2 | Open | Closed | Open | Closed | $U_o \cdot 0.257$ |
| ⋮ | | | | | |
| 84.3 | Closed | Closed | Closed | Closed | $U_o \cdot 0.343$ |

TABLE 2A

OPERATION OF FIG. 2 TO APPROXIMATE THE FUNCTION $U1 = U_o \sin \Phi$

| Analog Value of Angle $\Phi$ in Degrees | Condition of Switches S1 – S4 | | | | Analog Amplitude of Output at A in Volts $RG = 16R \cdot 1.801 = 28.8R$ |
|---|---|---|---|---|---|
| | S1 (45°) | S2 (22.5°) | S3 (11.2°) | S4 (5.6°) | |
| 0 | Closed | Closed | Closed | Closed | Zero |
| 5.6 | Closed | Closed | Closed | Open | $U_o \cdot 0.0335$ |
| 11.2 | Closed | Closed | Open | Closed | $U_o \cdot 0.065$ |
| 16.8 | Closed | Closed | Open | Open | $U_o \cdot 0.0943$ |
| 22.5 | Closed | Open | Closed | Closed | $U_o \cdot 0.122$ |
| ⋮ | | | | | |
| 45 | Open | Closed | Closed | Closed | $U_o \cdot 0.217$ |
| ⋮ | | | | | |
| 67.5 | Open | Open | Closed | Closed | $U_o \cdot 0.294$ |

TABLE 2B

OPERATION OF FIG. 2 TO APPROXIMATE THE FUNCTION U2 = Uo COS Φ

| Analog Value of Angle Φ in Degrees | Condition of Switches S1 – S4 | | | | Analog Amplitude of Output at A in Volts RG = 16R · 1.801 = 28.8R |
|---|---|---|---|---|---|
| | S1 (45°) | S2 (22.5°) | S3 (11.2°) | S4 (5.6°) | |
| 0 | Open | Open | Open | Open | Uo · 0.342 |
| 5.6 | Open | Open | Open | Closed | Uo · 0.327 |
| 11.2 | Open | Open | Closed | Open | Uo · 0.311 |
| 16.8 | Open | Open | Closed | Closed | Uo · 0.294 |
| 22.5 | Open | Closed | Open | Open | Uo · 0.276 |
| ⋮ | | | | | |
| 45 | Closed | Open | Open | Open | Uo · 0.195 |
| ⋮ | | | | | |
| 67.5 | Closed | Closed | Open | Open | Uo · 0.0315 |
| ⋮ | | | | | |
| 84.3 | Closed | Closed | Closed | Closed | Zero |

TABLE 3

OPERATION OF FIG. 3 TO APPROXIMATE THE FUNCTIONS U1 = Uo SIN Φ AND U2 = Uo COS Φ BETWEEN Φ = 0 AND Φ = 90°

| Analog Value of Angle Φ in Degrees | S4 (5.6°) | S4' (5.6°) | S3 (11.2°) | S3' (11.2°) | S2 (22.5°) | S2' (22.5°) | S1 (45°) | S1' (45°) | Analog Amplitude of Output, RG = R/2 · 1/1.801 | |
|---|---|---|---|---|---|---|---|---|---|---|
| | | | | | | | | | U1 | U2 |
| 0 | Open | Closed | Open | Closed | Open | Closed | Open | Closed | Zero | Uo |
| 5.6 | Closed | Open | Open | Closed | Open | Closed | Open | Closed | Uo · 0.0335 | Uo · 0.327 |
| 11.2 | Open | Closed | Closed | Open | Open | Closed | Open | Closed | Uo · 0.095 | Uo · 0.294 |
| 16.8 | Closed | Open | Closed | Open | Open | Closed | Open | Closed | Uo · 0/095 | Uo · 0.294 |
| 22.5 | Open | Closed | Open | Closed | Closed | Open | Open | Closed | Uo · 0.122 | Uo · 0.276 |
| ⋮ | | | | | | | | | | |
| 45 | Open | Closed | Open | Closed | Open | Closed | Closed | Open | Uo · 0.212 | Uo · 0.195 |
| 50.6 | Closed | Open | Open | Closed | Open | Closed | Closed | Open | Uo · 0.243 | Uo · 0.172 |
| 56.2 | Open | Closed | Closed | Open | Open | Closed | Closed | Open | Uo · 0.252 | Uo · 0.148 |
| 84.3 | Closed | Open | Closed | Open | Closed | Open | Closed | Open | Uo · 0.343 | Zero |

I claim as my invention:

1. A switching arrangement for generating analog approximations of trigonometric functions in response to digital representations of angle, said arrangement including a constant amplitude reference source, and a converter output for supplying an analog output, and further comprising:
   a. first digital-to-analog converter circuitry interposed between said constant amplitude reference source and said converter output and responsive to input digital angle values at least in the range of 0° to 45° to provide analog approximations of at least one trigonometric function selected from the sine function and the cosine function at said converter output, said first converter circuitry including a first resistance network comprising a first set of $n$ individual resistors having respective resistance values selected to be functions of successive powers of 2,
   b. a digital control register having a series of register stages for registering a digital angle value and including at least $n$ register stages sufficient to represent digital angle values in a range of 0° to 45° with such $n$ register stages representing respective angle values which are functions of successive powers of 2,
   c. a first switching circuit connected with said first resistance network and operable for connecting said individual resistors in respective first circuit configurations to approximate successive values of the trigonometric function, said first switching circuit being coupled with said $n$ register stages of said digital control register and being responsive to respective digital angle values therein to connect said resistors in respective corresponding circuit configurations to approximate the trigonometric function corresponding to the respective digital angle values,
   d. a correcting circuit interposed between said constant amplitude reference source and said converter output and comprising second digital-to-analog converter circuitry including a second resistance network with a second set of resistors having values which are functions of successive powers of 2, and
   e. a second switching circuit connected with said second resistance network and being operable for connecting said second resistance network in respective second circuit configurations to generate a correction function, said second switching circuit being connected with register stages of said digital control register and controlling the second resistance network to provide a correction function having maxima at odd multiples of 45° and minima at even multiples of 45° and having respective values in each of the respective second circuit configurations to modify the analog output at said converter output to more closely approximate the trigonometric function.

2. A switching arrangement in accordance with claim 1 characterized in that said correcting circuit is connected between said constant amplitude reference source and said first resistance network and produces a voltage at the input of the first resistance network which serves to precompensate for errors of the first resistance network in approximating the trigonometric function.

3. A switching arrangement in accordance with claim 1 characterized in that the correcting circuit is connected between said first resistance network and said converter output and provides post-compensation for errors of the first resistance network in approximating the trigonometric function.

4. A switching arrangement in accordance with claim 1 characterized in that a single common control register controls both said first switching circuit and said second switching circuit.

5. A switching arrangement according to claim 1 with said first digital-to-analog converter circuitry including two of said first resistance networks controlled by said first switching circuit, said first switching circuit being responsive to respective digital angle values to connect the resistors of one of said first resistance networks in accordance with the direct value of the angle digits and to connect the other of the first resistance networks in accordance with the complement of the digits of the registered digital angle value, and a switching register responsive to the quadrant of the digital angle value for selectively inverting the control of said first switching circuit from said digital control register in the case of angle value from 90° to 180° and from 270° to 360°.

6. A switching arrangement according to claim 5 characterized in that a further switching register is interposed between the control register and the second switching circuit for carrying out an inversion of the output from said digital control register to said second switching circuit in the case of angle values between 45° and 90°, 135° and 180°, 225° and 270°, and 315° and 360°.

7. A switching arrangement according to claim 1 with said first set of individual resistors having respective resistance values related in accordance with successive terms of a geometrical series.

8. A switching arrangement in accordance with claim 1 with said first digital-to-analog converter circuitry comprising two of said first resistance networks, said first switching circuit controlling the circuit configurations of one of said first resistance networks in accordance with a plural order binary signal generated as a function of the registered digital angle value, and controlling the other of said first resistance networks in accordance with the complement of said plural order binary signal whereby the output of one of said first resistance networks approximates a sine function while the output of the other of said first resistance networks approximates the cosine function of the same angle, said correcting circuit being responsive to a plural order binary signal representing angle values between 0 and 22.5°, and having two of said second resistance networks, said second switching circuit operating one of said resistance networks in accordance with the direct value of the plural order binary signal and operating the other of said second resistance networks in accordance with the complement of the plural order binary signal, and an inverter circuit interposed between said plural order binary signal and said second switching circuit and responsive to the stage of said digital control register representing an angle of 45° to invert said plural order binary signal at 90° intervals over the range of said digital control register.

9. A switching arrangement in accordance with claim 1 with said first digital-to-analog circuitry comprising two of said first resistance networks to provide two sets of $n$ individual resistors, each set having respective resistance values selected to be functions of successive powers of 2, the first switching circuit being connected with both of said first resistance networks and controlling the circuit configurations of the respective first resistance networks to approximate values of the sine and cosine functions respectively, of the digital angle value registered in said digital control register.

10. A switching arrangement in accordance with claim 9 with said correcting circuit being connected between said constant amplitude reference source and each of said first resistance networks to produce an input analog signal common to both of said first resistance networks which serves to precompensate for errors of the first resistance networks in approximating the sine and cosine functions, respectively.

11. A switching arrangement according to claim 10 with a single common digital control register controlling both said first switching circuit and said second switching circuit to generate precompensated sine and cosine functions based on the angle value registered by said single common digital control register.

12. A switching arrangement according to claim 9 with said correcting circuit comprising two second resistance networks connected between the respective first resistance networks and the respective converter outputs to provide postcompensation for the errors of the respective first resistance networks in approximating the sine and cosine functions respectively, each of said second resistance networks providing a correction function having maxima at odd multiples of 45° and minima at even multiples of 45°.

13. A switching arrangement for generating analog approximations of trigonometric functions in response to digital representations of angle, said arrangement including a constant amplitude reference source and a pair of converter outputs for supplying analog outputs, and further comprising:
  a. first digital-to-analog converter circuitry interposed between said constant amplitude reference source and said converter outputs, said first converter circuitry including respective resistance network means for generating sine and cosine approximations respectively, and comprising a set of $n$ individual resistor means having respective resistance values selected to generate sine and cosine approximations for digital angle values corresponding to successive powers ot 2.
  b. a digital control register having a series of register stages for registering a digital angle value and including at least $n$ register stages corresponding to successive powers of 2 and sufficient to represent digital angle values in a range of 0° to 45°,
  c. a first switching circuit connected with said resistance network means and operable for connecting said individual resistor means in respective circuit configurations to generate approximations of the sine and cosine functions at the respective converter outputs, said first switching circuit being coupled with said $n$ register stages of said digital control register and being responsive to respective digital angle values therein to connect said resistor means in respective corresponding circuit configurations to generate sine and cosine approximations corresponding to the respective digital angle values,
  d. a common correcting circuit connected between said constant amplitude reference source and said first converter circuitry and comprising second digital-to-analog converter circuitry having a common output connected via the respective resistance network means with the respective converter outputs, the second digital-to-analog converter circuitry comprising a common resistance network with a single set of resistors having values selected to approximate respective different common corrections needed at respective digital angle values corresponding to successive powers of 2 such that the sine and cosine functions are substantially more closely approximated at said converter outputs, and e. a second switching circuit connected with said common resistance network and operable for connecting said common resistance network in respective circuit configurations, said second switching circuit being connected to the outputs of the digital control register so as to generate a correction function at the common output of said second digital-to-analog converter circuit having maxima at odd multiples of 45° and minima at even multiples of 45°, and so as to systematically vary said correction function for each incremental angle value over the range of such respective digital angle values corresponding to successive powers of 2.

* * * * *